(12) United States Patent
Hosein

(10) Patent No.: US 11,862,746 B2
(45) Date of Patent: Jan. 2, 2024

(54) ULTRAWIDE-ANGLE LIGHT COLLECTING MODULES FORMED BY DIRECT LIGHT-WRITING OF NANOPARTICLE-BASED METALLO-DIELECTRIC OPTICAL WAVEGUIDES

(71) Applicant: Ian D. Hosein, Minoa, NY (US)

(72) Inventor: Ian D. Hosein, Minoa, NY (US)

(73) Assignee: SYRACUSE UNIVERSITY, Syracuse, NY (US)

(*) Notice: Subject to any disclaimer, the term of this patent is extended or adjusted under 35 U.S.C. 154(b) by 293 days.

(21) Appl. No.: 16/856,301

(22) Filed: Apr. 23, 2020

(65) Prior Publication Data

US 2020/0343399 A1 Oct. 29, 2020

Related U.S. Application Data

(60) Provisional application No. 62/837,478, filed on Apr. 23, 2019.

(51) Int. Cl.
*H01L 31/042* (2014.01)
*H01L 31/054* (2014.01)
*H01L 31/18* (2006.01)
*H01L 31/048* (2014.01)
*B82Y 20/00* (2011.01)

(52) U.S. Cl.
CPC ...... *H01L 31/0543* (2014.12); *H01L 31/0481* (2013.01); *H01L 31/186* (2013.01); *B82Y 20/00* (2013.01)

(58) Field of Classification Search
CPC ............ H01L 31/0543; H01L 31/0481; H01L 31/186; B82Y 20/00
See application file for complete search history.

(56) References Cited

U.S. PATENT DOCUMENTS

| 2009/0221111 A1* | 9/2009 | Frolov | H01L 31/0543 257/E31.127 |
| 2012/0204950 A1* | 8/2012 | Magdassi | H01L 31/022466 977/734 |
| 2015/0333195 A1* | 11/2015 | Cheng | H01L 31/02366 438/71 |

FOREIGN PATENT DOCUMENTS

| WO | WO 2010/050318 | * | 5/2010 | ............ H01B 5/14 |
| WO | WO 2017/100516 | * | 6/2017 | ............ C01G 15/00 |

OTHER PUBLICATIONS

Translation of WO 2010/050318, pp. 1-9, 2010. (Year: 2010).*

* cited by examiner

*Primary Examiner* — Thanh Truc Trinh
(74) *Attorney, Agent, or Firm* — David L. Nocilly

(57) ABSTRACT

A metallo-dielectric waveguide array used as an encapsulation material for silicon solar cells. The array is produced through light-induced self-writing combined with in situ photochemical synthesis of silver nanoparticles. Each waveguide comprises a cylindrical core consisting of a high refractive index polymer and silver nanoparticles homogeneously dispersed in its medium, all of which are surrounded by a low refractive index common cladding. These waveguide array films are processed directly over a silicon solar cell.

20 Claims, 20 Drawing Sheets

ULTRAWIDE-ANGLE LIGHT COLLECTING MODULES FORMED BY DIRECT LIGHT-WRITING OF NANOPARTICLE-BASED METALLO-DIELECTRIC OPTICAL WAVEGUIDES

CROSS-REFERENCE TO RELATED APPLICATIONS

The present application claims priority to U.S. Provisional Application No. 62/837,478, filed on Apr. 23, 2019.

STATEMENT REGARDING FEDERALLY SPONSORED RESEARCH OR DEVELOPMENT

This invention was made with government support under Grant No. 1903592 awarded by the National Science Foundation (NSF). the government has certain rights in the invention.

BACKGROUND OF THE INVENTION

1. Field Of The Invention

The present invention to solar cells and, more specifically, to a light collecting waveguides formed into the encapsulation material of silicon solar cells.

2. Description Of The Related Art

The increasing dominance of photovoltaic modules for energy conversion and its decreasing manufacturing costs has placed an imperative that any approach to further increase performance must keep costs low and be easily integrated into current manufacturing chains. One of the most low-cost and effective approaches to increase light capture and conversion is through engineering light management structures into the encapsulant materials, whose general purpose is to protect the solar cell material. Optical structures explored thus far include included nanoparticle coatings, nanostructured diffractive, diffuse and scattering layers, nano-texturing, geometric structures, contact cloaking, and back-contact solar cell architectures.

Particularly, the application of nanoparticles as diffuse scattering components is quite attractive, owing to the simplicity of their incorporation into the encapsulation layer through straightforward coating methods. Their generally agreed mechanism for their enabling greater enhancement is via scattering light beyond the "loss cone" as well as mitigation losses from the metallic front contacts. Glass and polymer nanoparticles have been used to this end, commonly as a top coating to a glass or polymer encapsulant already overlaid on the solar cell. Silver is most commonly used as it has relatively low parasitic absorption, and it is commonly incorporated as coating directly on the solar cell surface. Its capability to provide enhancement is through facilitating energy transfer via the generation of "hot" electrons. For example, a monolayer of metal nanoparticles with a surface coverage of at least 10% can interact with all incident light, enabling broadband usage. However, little has been explored with regards to the incorporation of silver nanoparticles embedded in the encapsulation materials (i.e., not in contact with the solar cell surface). For very small silver nanoparticles sizes (<50 nm) the surface plasmon resonance is shifted into the UV (or deep blue), allowing silver to behave as very low loss scattering centers in the solar cell. Hence, such a metallo-direction encapsulant is an interesting composite to explore.

Recently, the capability for polymer waveguide arrays to enhance the non-normally incident light collection has been demonstrated. The waveguide arrays are produced in a photo-reactive blend of a high and low refractive index polymer irradiate with an array of microscale optical beams. Each beam undergoes self-trapping owing to photopolymerization-induce optical nonlinearity, resulting in divergence free propagation of the beams across the medium. The sustained polymerization in the regions of the optical beam results in photopolymerization-induced phase separation of the low-index component into the surrounding dark regions, thereby producing the core-cladding architecture with cylindrical geometry, a miniature fiber optic. When overlaid on a solar cell, non-normally incident light can be collected within the acceptance cone of the waveguides, leading to greater light collection and conversion that with a uniform encapsulant. This enhance comes from convert non-normally incident light to quasi-normally incident light, which also specifically mitigates contact shading, an effect exacerbated at greater incident angles. However, the waveguide-optics that dictate its operation characteristics limit the collection window. In order for these waveguide array coatings to have a stronger angular collection window, stronger light-matter interactions with light are needed. Accordingly, there is a need in the field for a waveguide array structure with a wider acceptance window with an enhanced collection range.

BRIEF SUMMARY OF THE INVENTION

The present invention is a solar cell that includes a waveguide array that provides for an enhanced collection range and improved efficiency. More specificall, the solar cell comprises a surface having a series of contacts thereon, and a resin cast over the surface and the series of contacts, wherein the resin defines a series of waveguides that extend vertically from the surface through the resin and include a core having a plurality of silver nanoparticles distributed therein. The series of waveguides may be aligned to extend through the resin is misalignment with the series of contacts. The series of waveguides may also be aligned to extend through the resin in alignment with the plurality of series of contacts. The silver nanoparticles may comprise AgSbF6. The silver nanoparticles may have a diameter of between 10 and 50 nanometers. The resin may comprise a polymerized blend of polydimethylsiloxane and an optical adhesive. The concentration of the plurality of silver nanoparticles in the core may comprise between 0.1 and 0.5 percent by weight.

The present invention also includes a method of preparing a solar cell, where a first step is providing a solar cell surface having a series of contacts thereon. A resin is then cast over the solar cell surface, wherein the resin includes a plurality of silver nanoparticles. Next, the resin is irradiated to cause polymerization of the resin until a series of waveguides form in and extend through in the resin. The step of irradiating the resin comprises exposing the resin to blue light. The step of irradiating the resin may also comprise exposing the resin to blue light through a mask defining a size and a location for each of the series of waveguides. The mask includes a series of apertures having a diameter of 40 μm and that are spaced apart by 200 μm, each of which defines one of the series of waveguides. The series of waveguides that form in the resin may be misaligned with the series of contacts. The series of waveguides that form in the resin may be aligned with the series of contacts. The plurality of silver nanoparticles may comprise AgSbF6. The plurality of silver nanoparticles may have a diameter of between 10 and 50 nanometers. The concentration of the plurality of silver nanoparticles in the core may comprise between 0.1 and 0.5 percent by weight. The resin may comprise a polymerized blend of polydimethylsiloxane and an optical adhesive.

BRIEF DESCRIPTION OF THE SEVERAL VIEWS OF THE DRAWING(S)

The present invention will be more fully understood and appreciated by reading the following Detailed Description in conjunction with the accompanying drawings, in which.

Figures 2A, 2B, 2C, 2D, 2E, 2F:
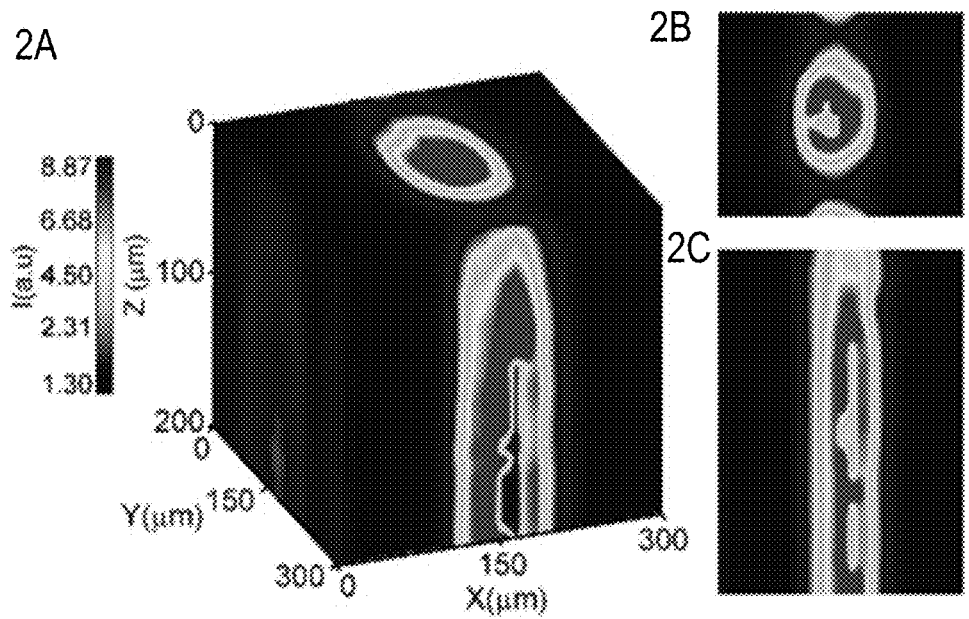
Figures 2G, 2H, 2I:
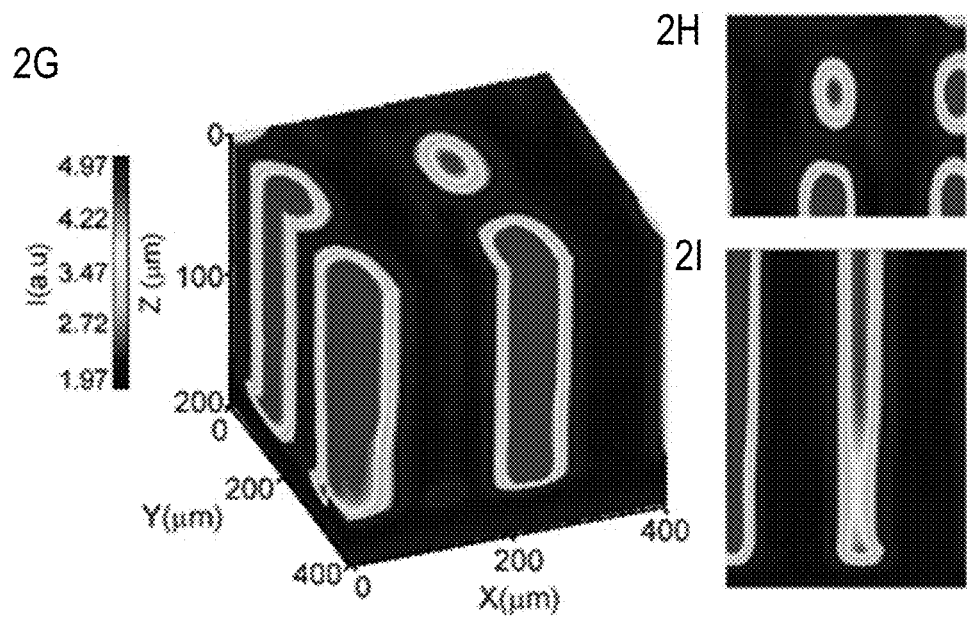
Figures 2K, 2L, 2M:
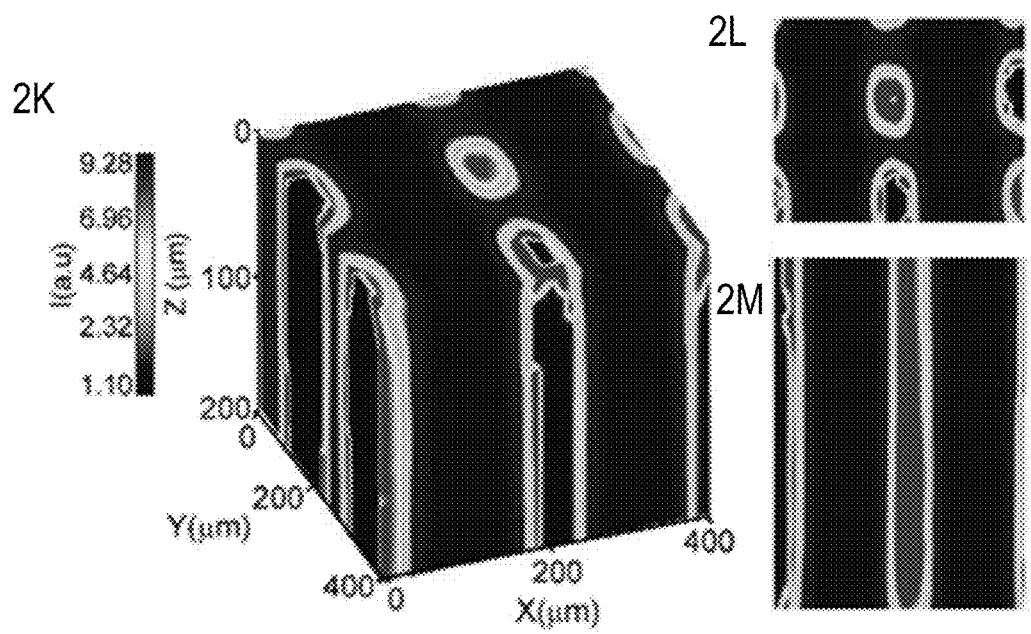
Figures 2N, 2O, 2P:
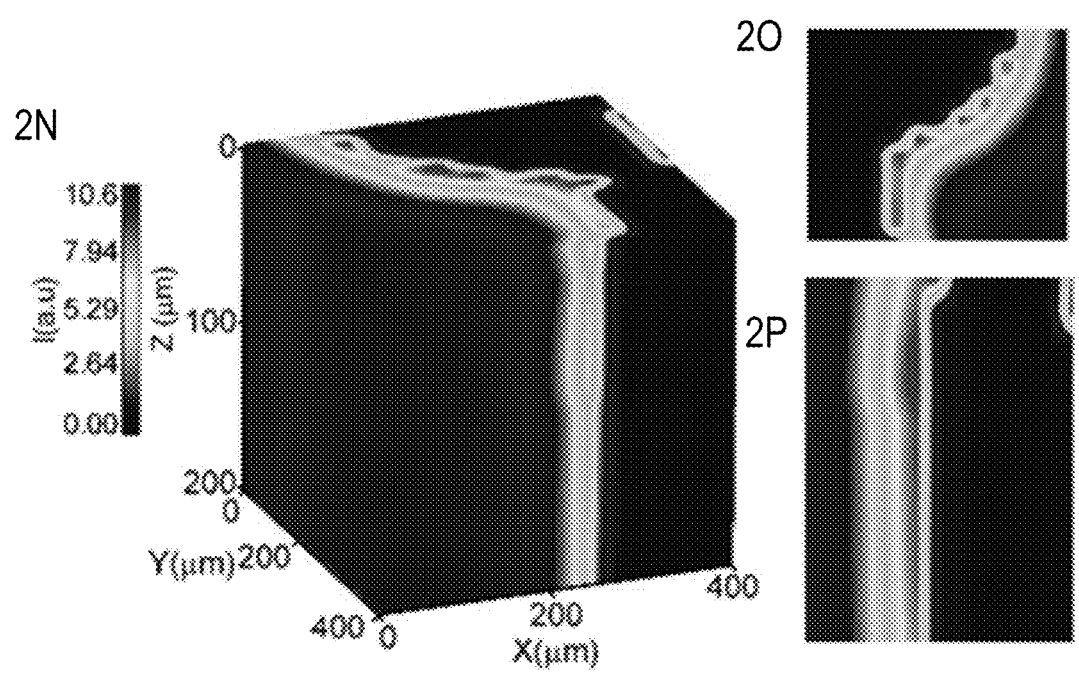

FIG. 2A through 2P is a series of Raman volume maps of self-written waveguides with FIG. 2A, FIG. 2D, FIG. 2G, FIG. 2K, FIG. 2N showing 0.1%, 0.5%, 1.0%, 2.0%, and 3% Ag concentration, respectively. FIG. 2B, FIG. 2E, FIG. 2H, FIG. 2L, FIG. 2O shows xy-slices through the middle the waveguides, revealing their cross-sectional profiles. FIG. 2C, FIG. 2F, FIG. 2I, FIG. 2M, FIG. 2P shows yz-slices through the core central axis, revealing its longitudinal profile that extends over the depth of the film. Red zones indicate regions rich silver. Black color in the center of the waveguides is an artifact of signal saturation.

Figure 3:
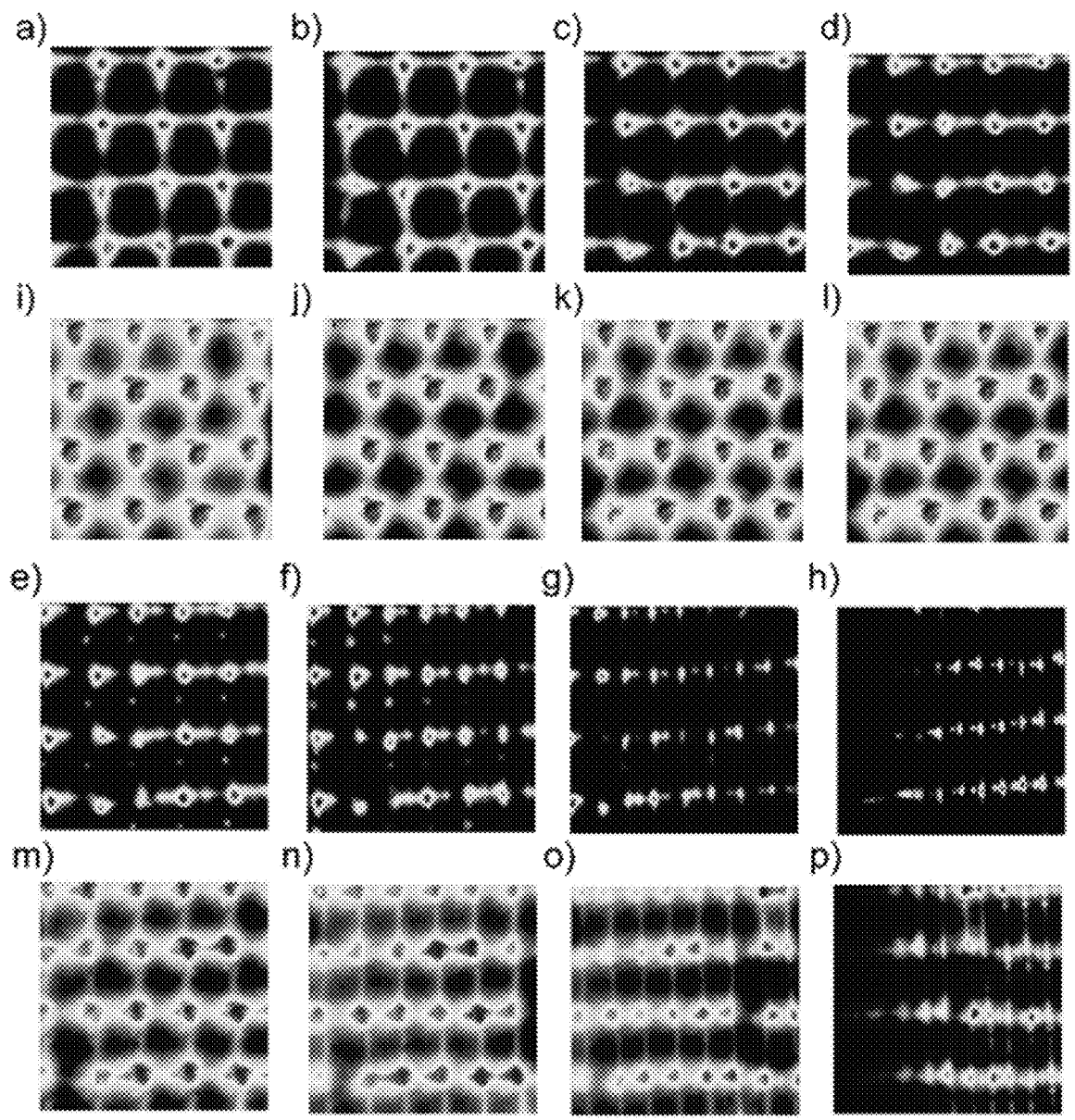

FIG. 3 is a series of CCD images of transverse intensity profile of the waveguide arrays from angles 0 to 70° (left to right) for (a-h) metallo-dielectric waveguide arrays (0.5 wt %) and (i-p) dielectric waveguide arrays (i.e., no Ag).

Figures 4A, 4B:
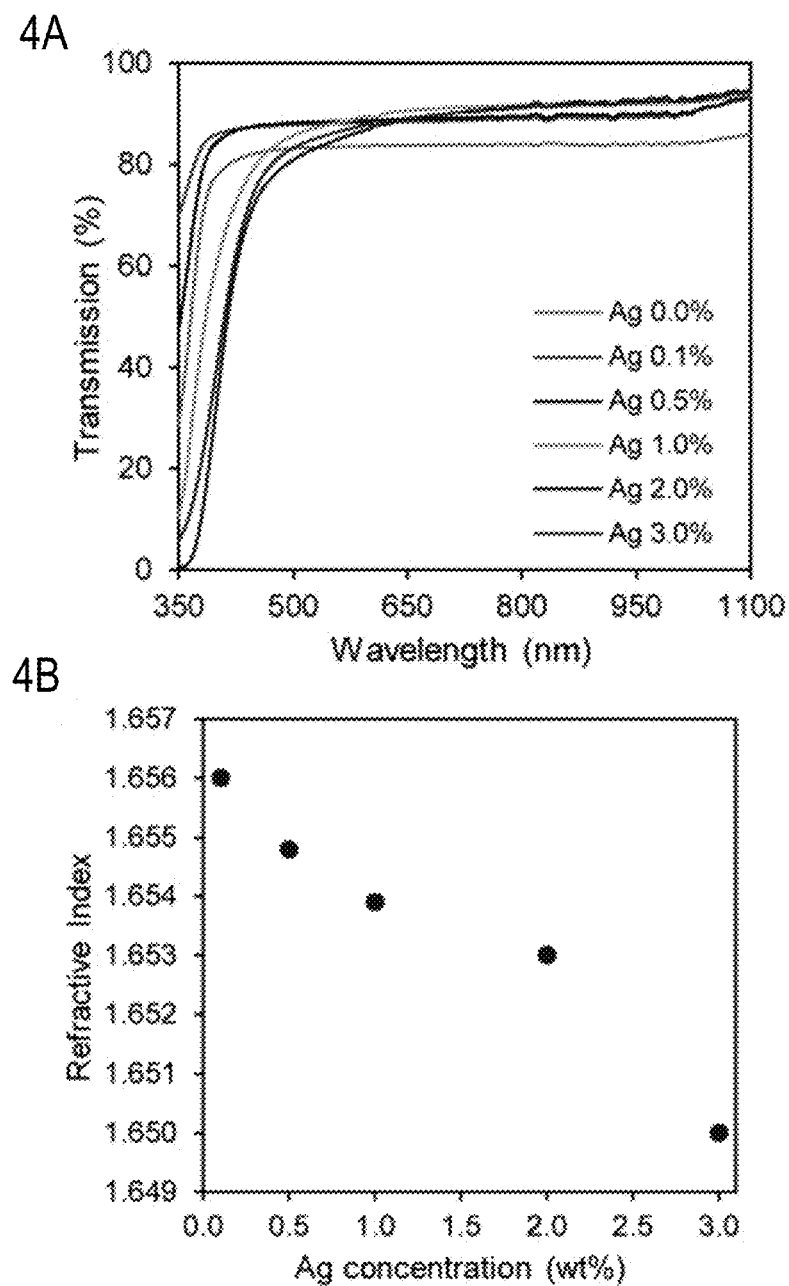

FIG. 4A and 4B are optical characterizations of Ag doped waveguide arrays as a function of Ag doping concentration showing: FIG. 4A-Refractive index and FIG. 4B-Transmission.

Figure 5:
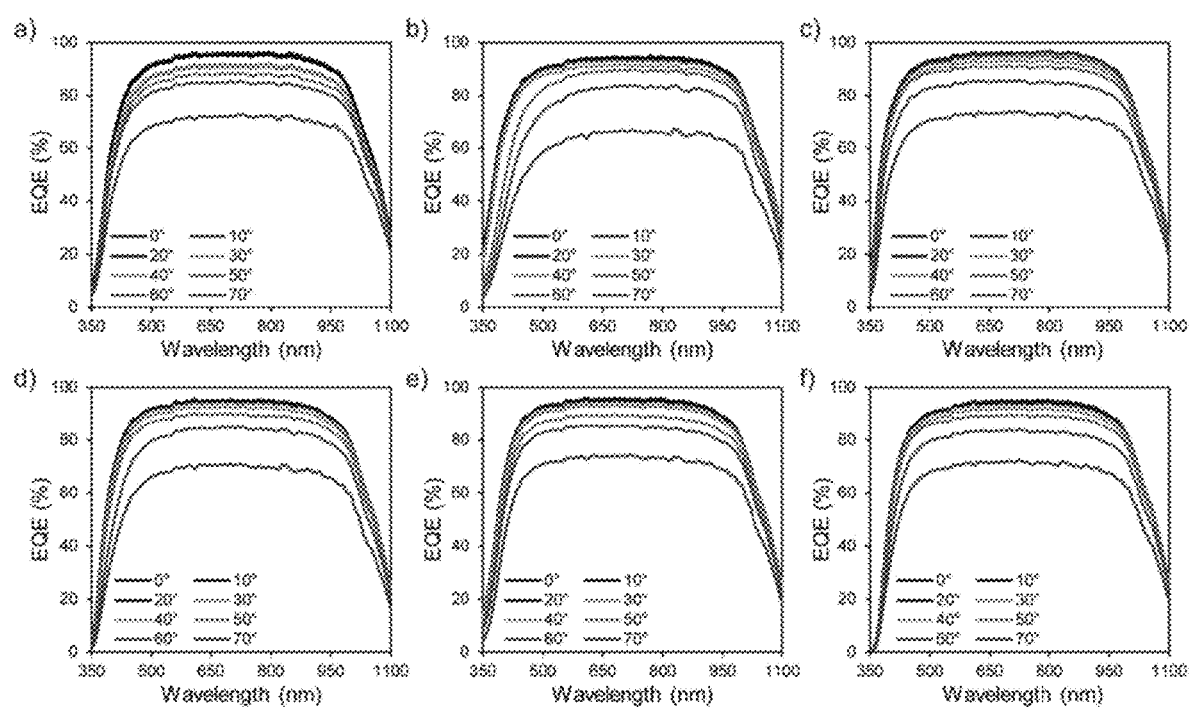

FIG. 5 is a series of graphs of the efficiency measurements of encapsulated solar cells as a function of incident angle for waveguide arrays processed with (a-f) 0%, 0.1%, 0.5%, 1.0%, 2.0% and 3% silver precursor, respectively.

Figure 6:
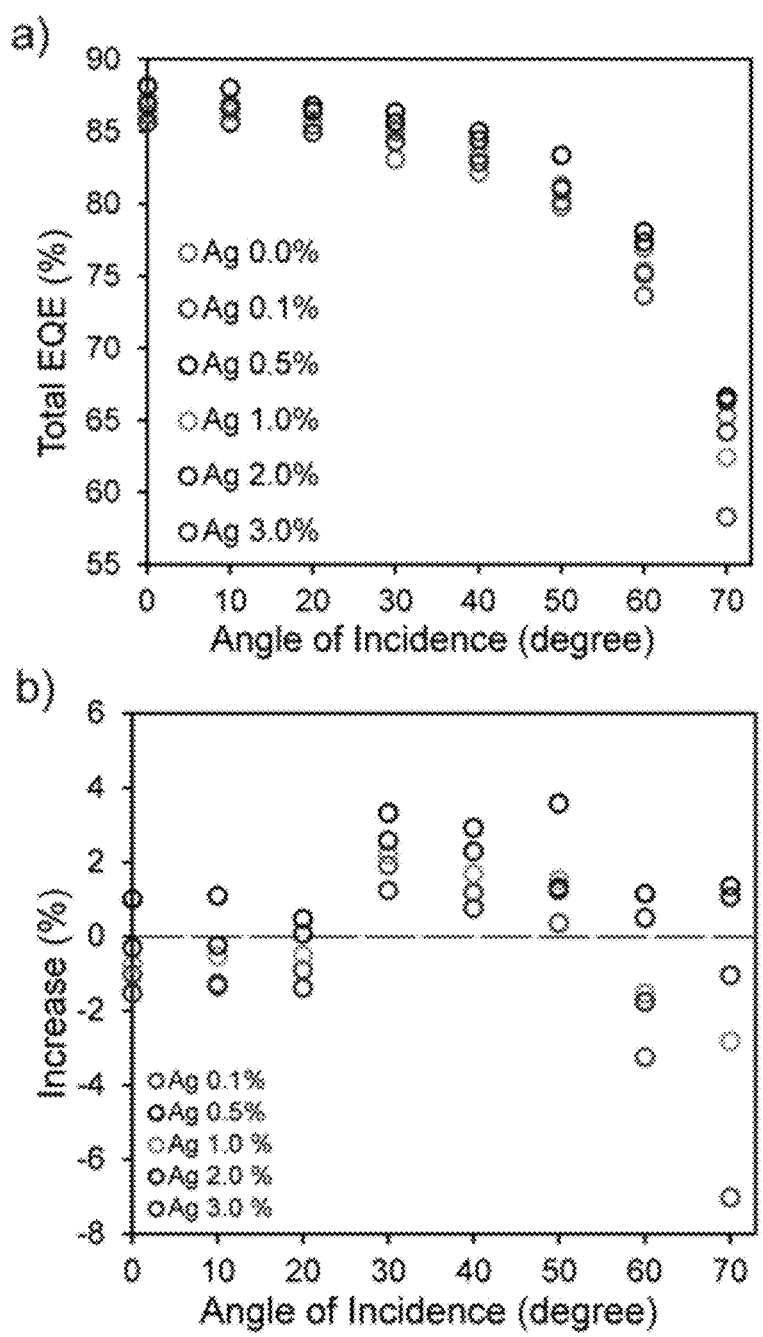
Figure 7:
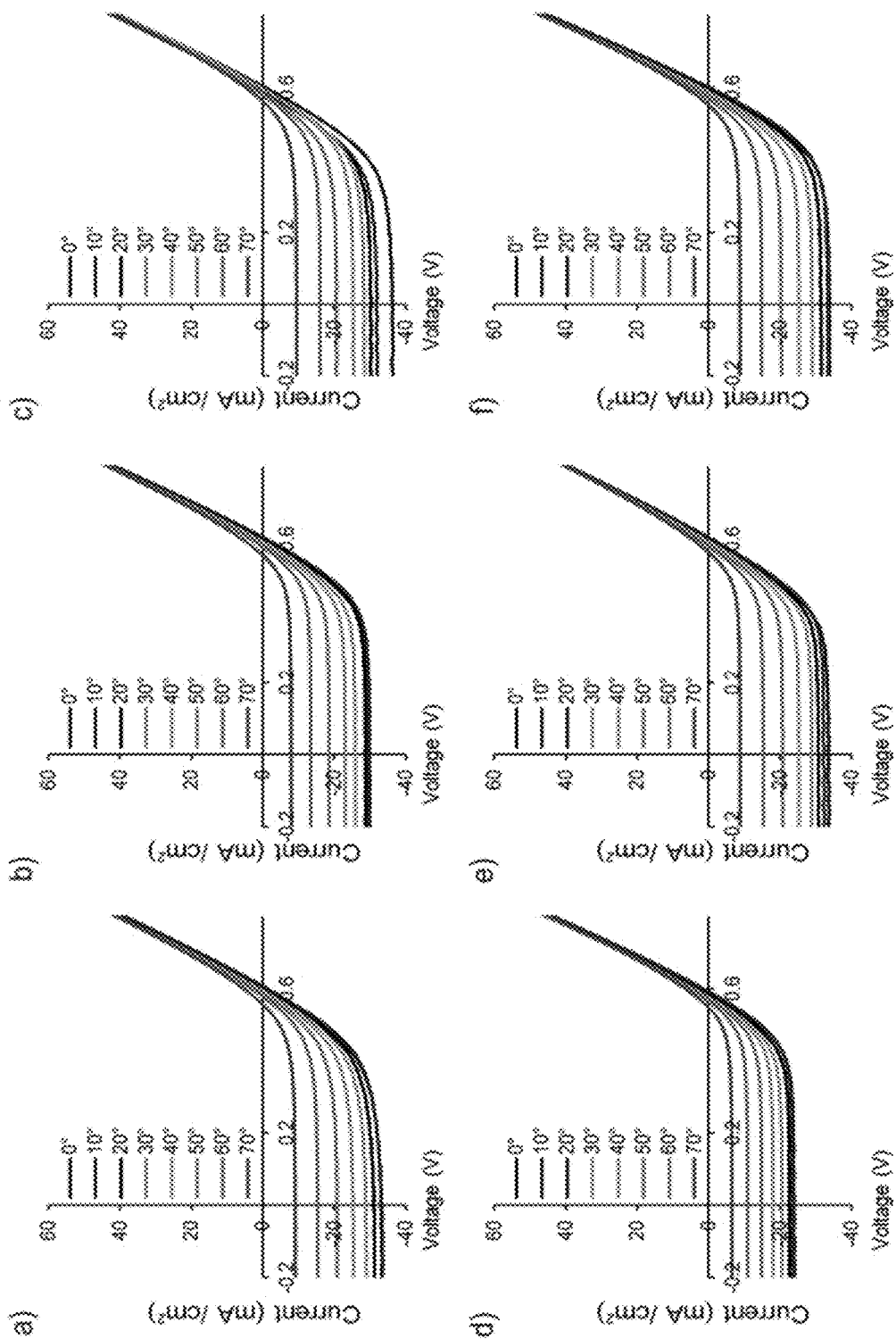
Figure 8:
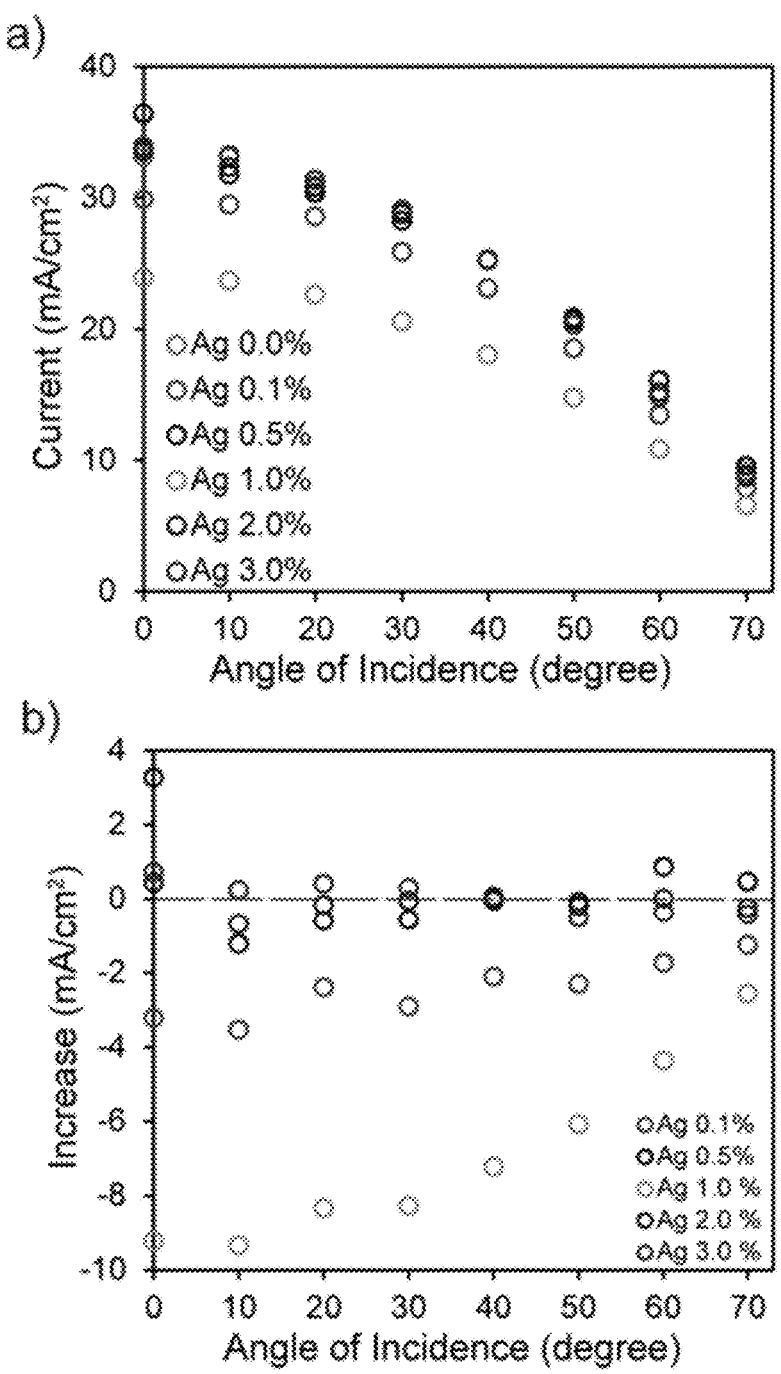
Figure 9:
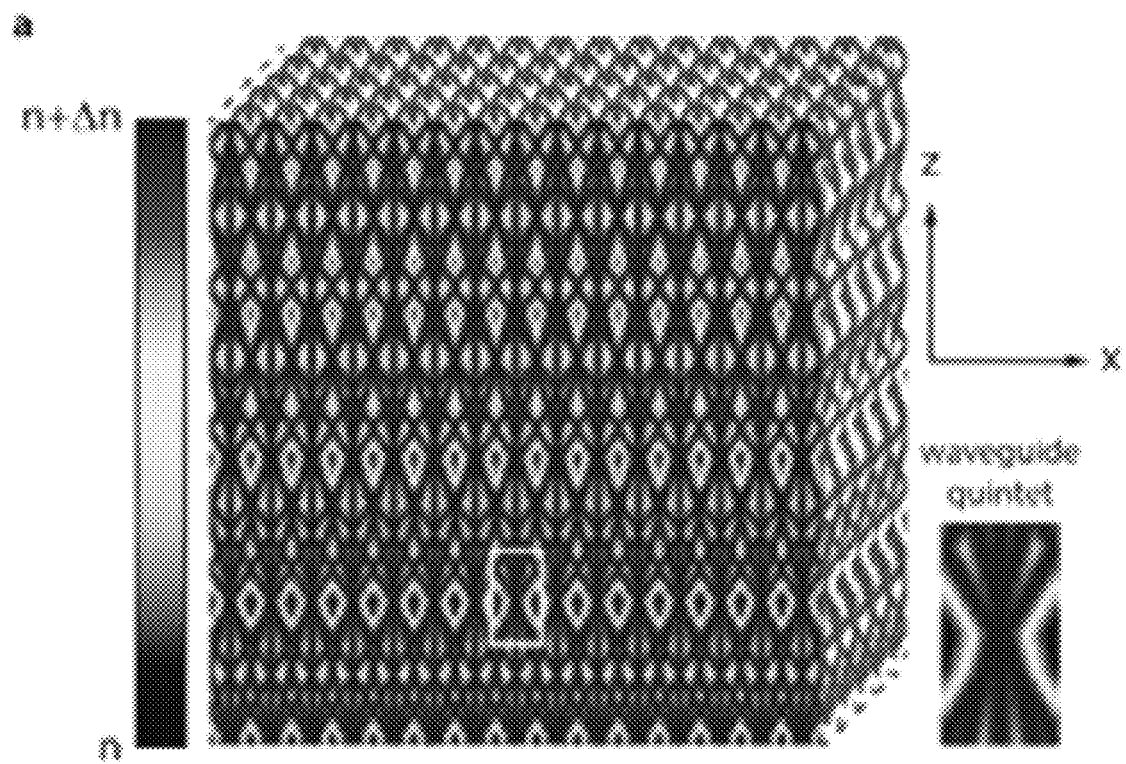
Figure 10:
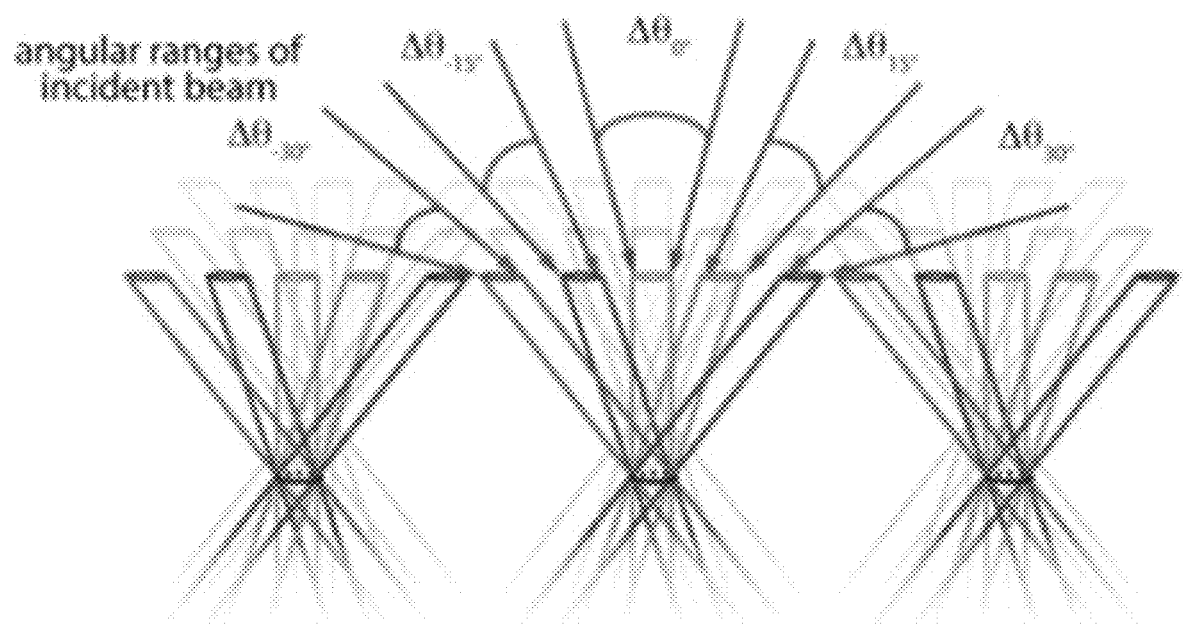
Figure 11:
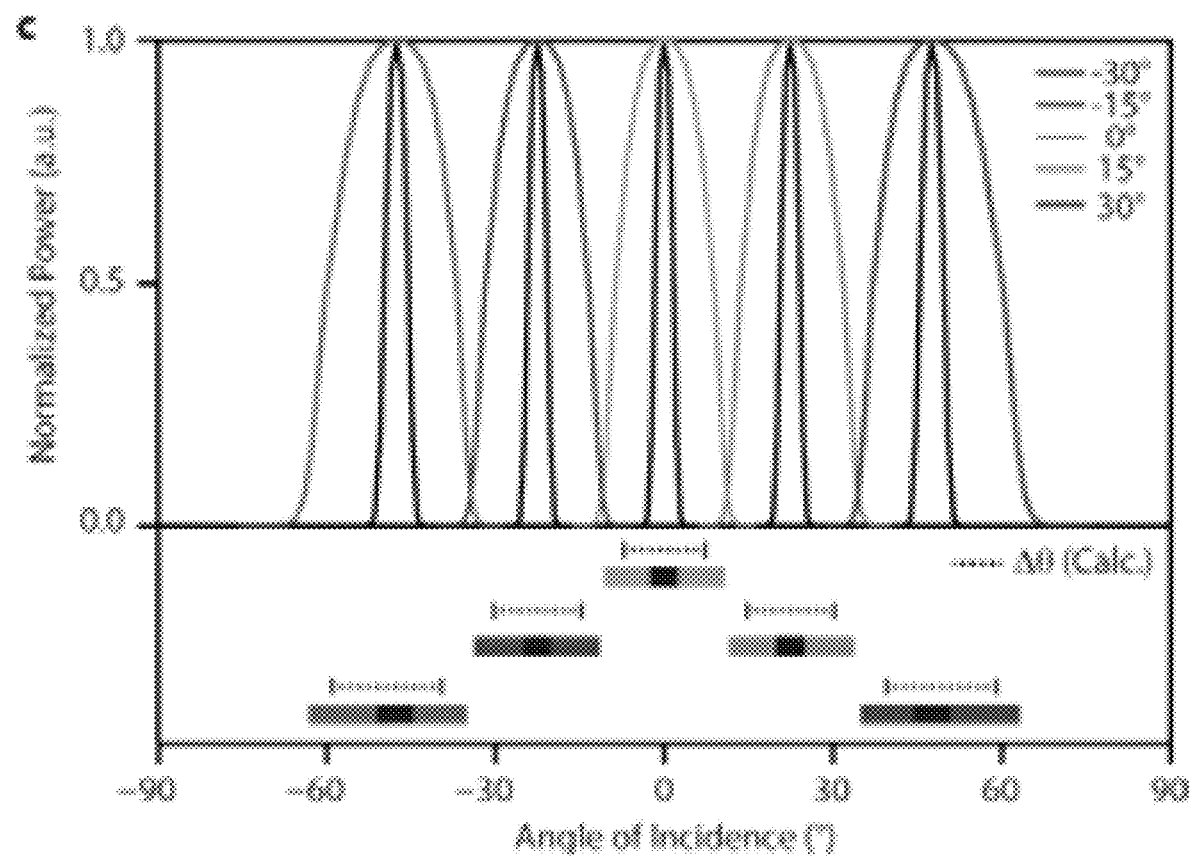
Figure 12:
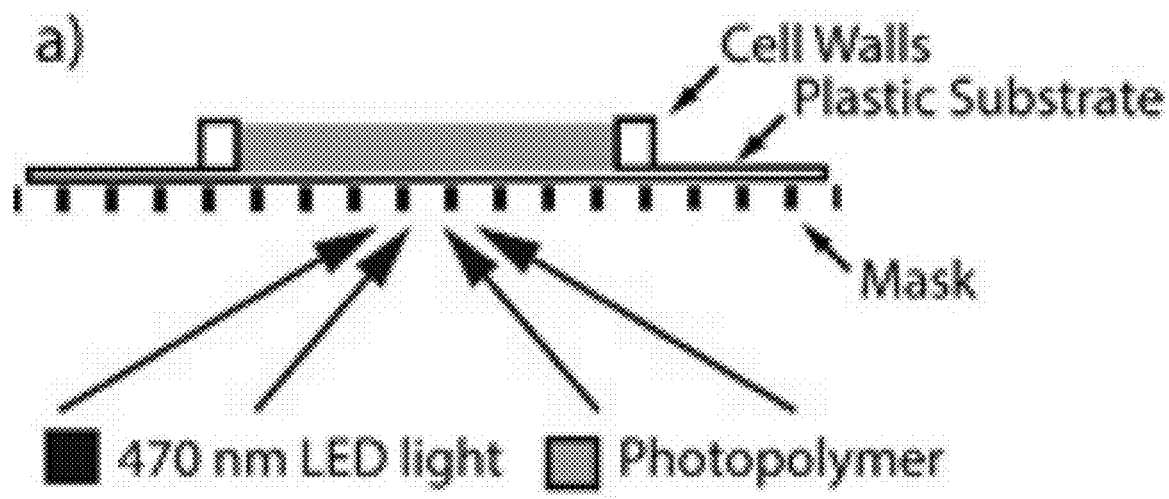
Figure 13:
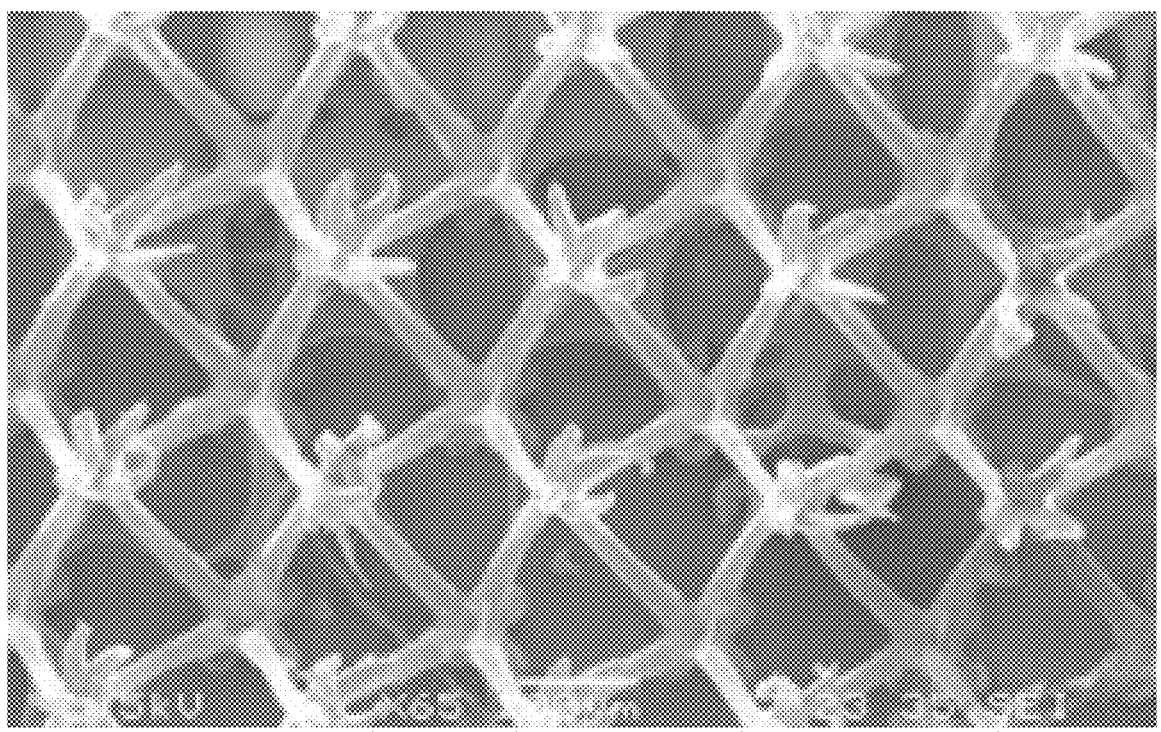
Figure 14A:
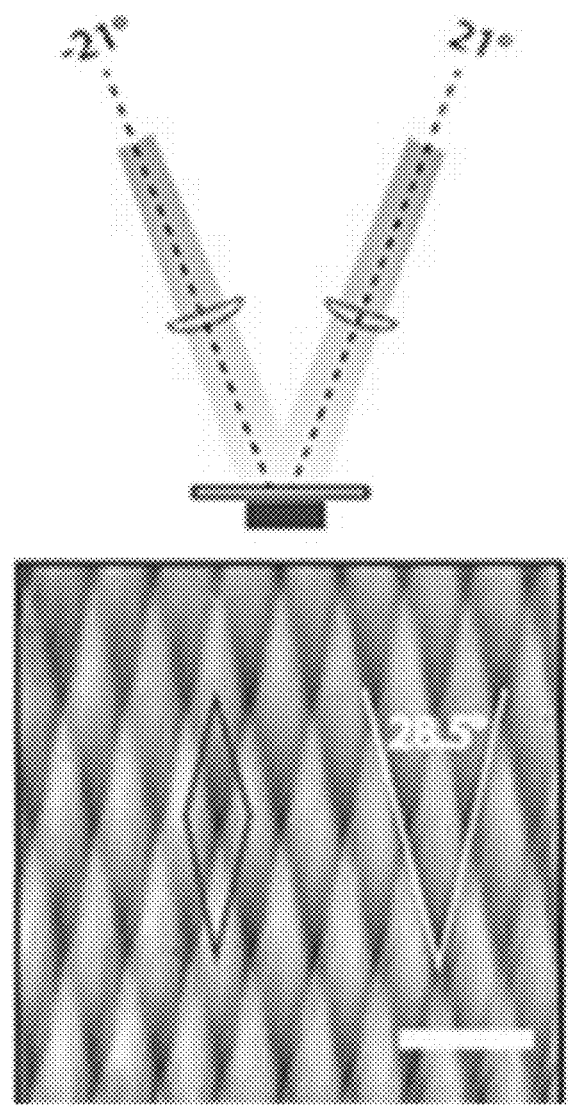
Figure 14B:
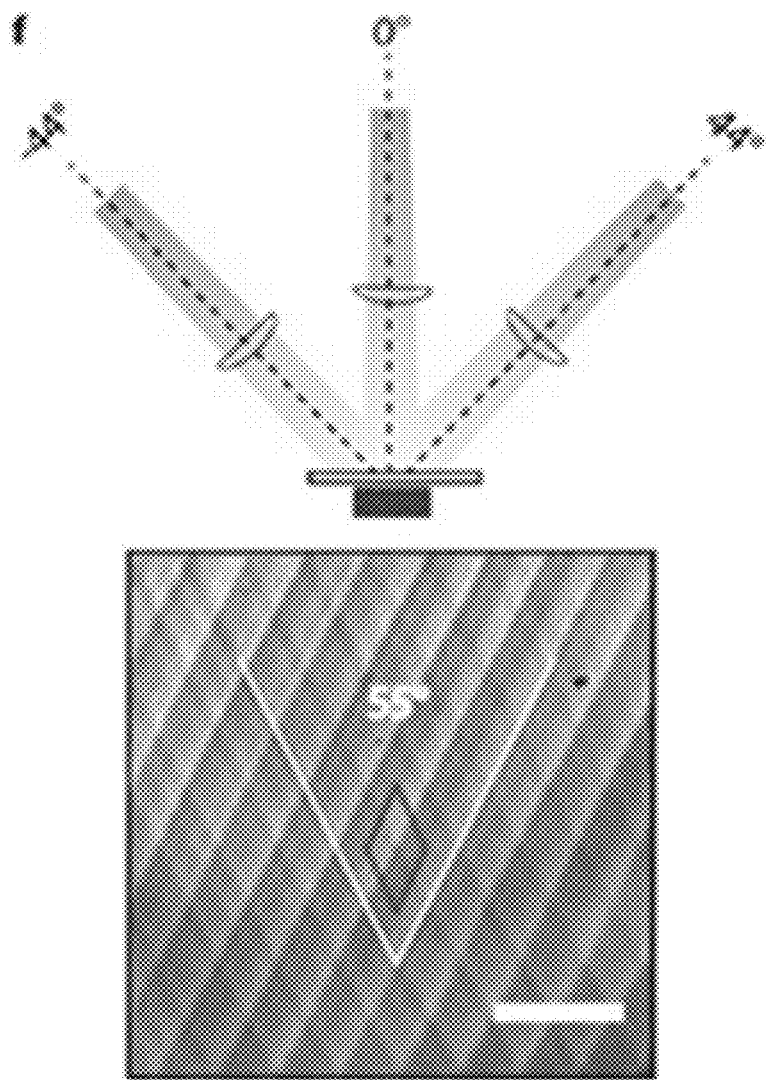
Figure 14C:
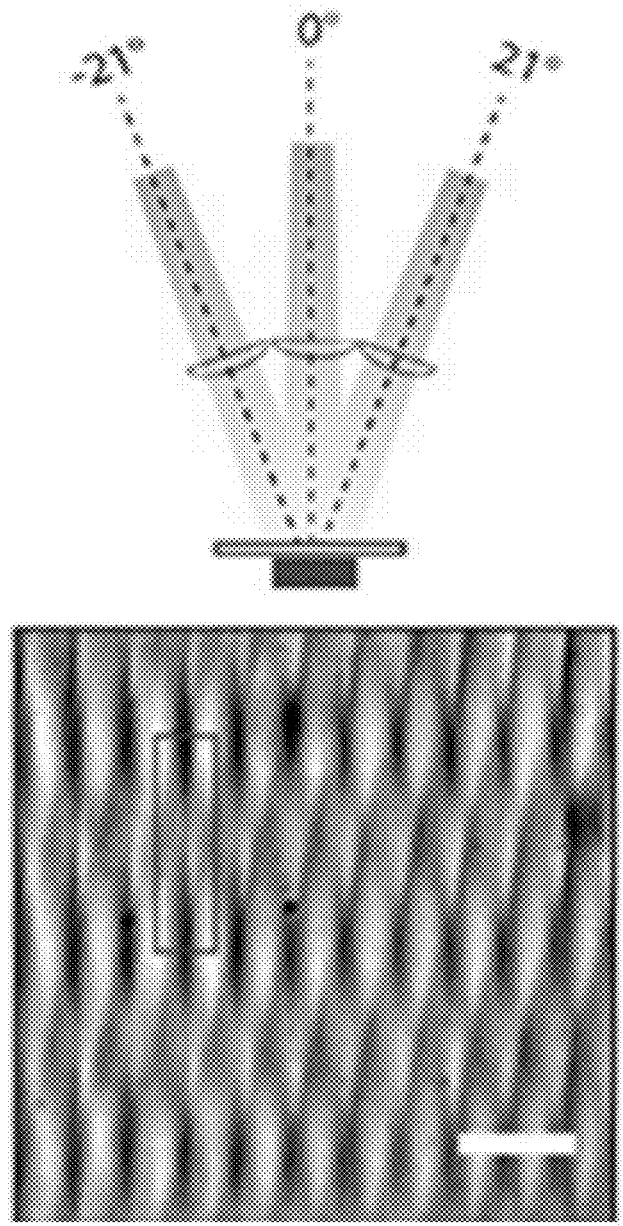
Figure 14D:
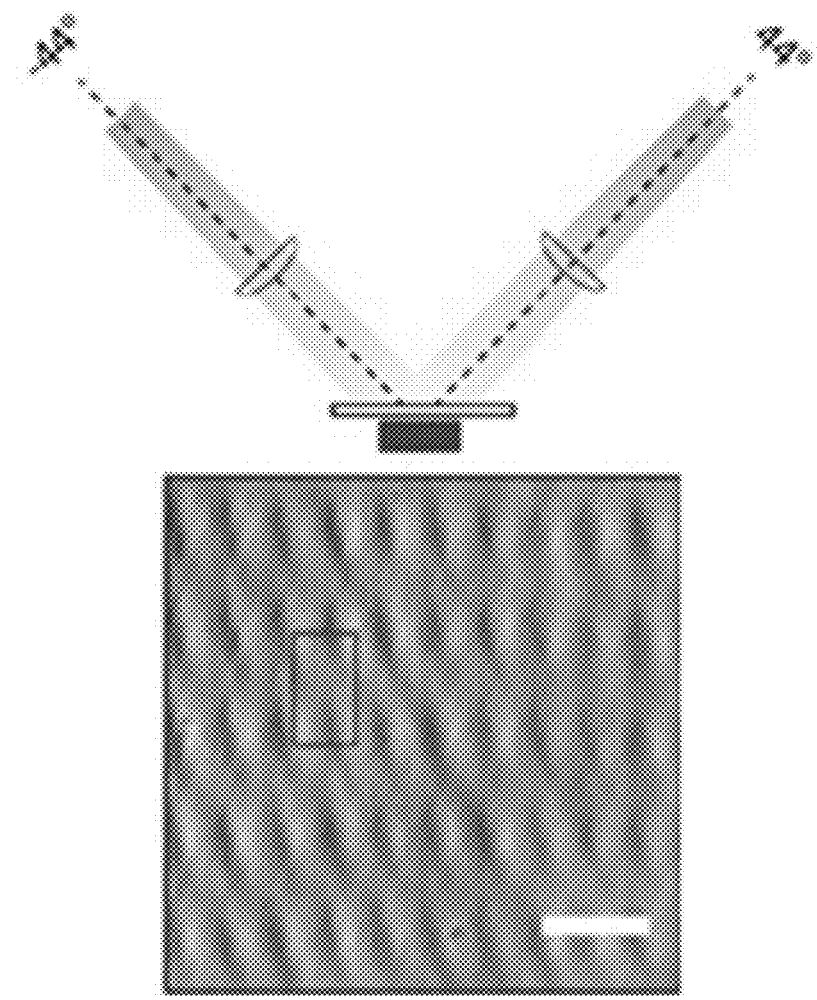

FIG. 6 is a series of graphs of (a) the total EQE measurements as a function of angle of incidence for waveguide arrays processed with different Ag concentrations; and (b) the nominal increase in total EQE of Ag doped waveguide arrays relative to an undoped waveguide array;

FIG. 7 is a series of graphs of the performance measurements of encapsulated solar cells, where: (a-f) are I-V curves as a function of angle of incidence for waveguide arrays processed with 0%, 0.1%, 0.5%, 1/0%, 2.0% and 3% silver precursor, respectively; and FIG. 8 is a series of graphs of graphs of (a) the angle of incidence versus current; and (b) the angle of incidence versus increase in current for Ag doped waveguide arrays;

FIG. 9 is a three-dimensional model of a multiple waveguide lattice having a stack of xz planes, each comprising five intersecting waveguide lattice oriented at −30°, −15°, 0, 15°, and 30° relative to the surface normal (z), with the inset showing a single intersection of waveguides;

FIG. 10 is a diagram showing that each waveguide has an acceptance angular range of Δθn where n=the waveguide orientation angle and the collection range is the sum of all Δθn;

FIG. 11 is a graph of the collection range showing transmitted power at each waveguide exit versus the incidence angle, where the bar chart depicts Δθn for each waveguide and Δθn values from ray optics based caluculations of waveguiding are included for comparison;

FIG. 12 is a schematic of a multi-LED arrangement for producing waveguides in a lattice structure according to the present invention;

FIG. 13 is an image of multiple lattices waveguides produced according to the present invention;

FIG. 14A is a schematic and corresponding image of the three-dimensional microstructure of intersecting lattice waveguide structure formed according to the present invention at a first set of angles;

FIG. 14B is a schematic and corresponding image of the three-dimensional microstructure of intersecting lattice waveguide structure formed according to the present invention at a second set of angles;

FIG. 14C is a schematic and corresponding image of the three-dimensional microstructure of intersecting lattice waveguide structure formed according to the present invention at a third set of angles; and FIG. 14D is a schematic and corresponding image of the three-dimensional microstructure of intersecting lattice waveguide structure formed according to the present invention at a fourth set of angles.

DETAILED DESCRIPTION OF THE INVENTION

Figure 1A:
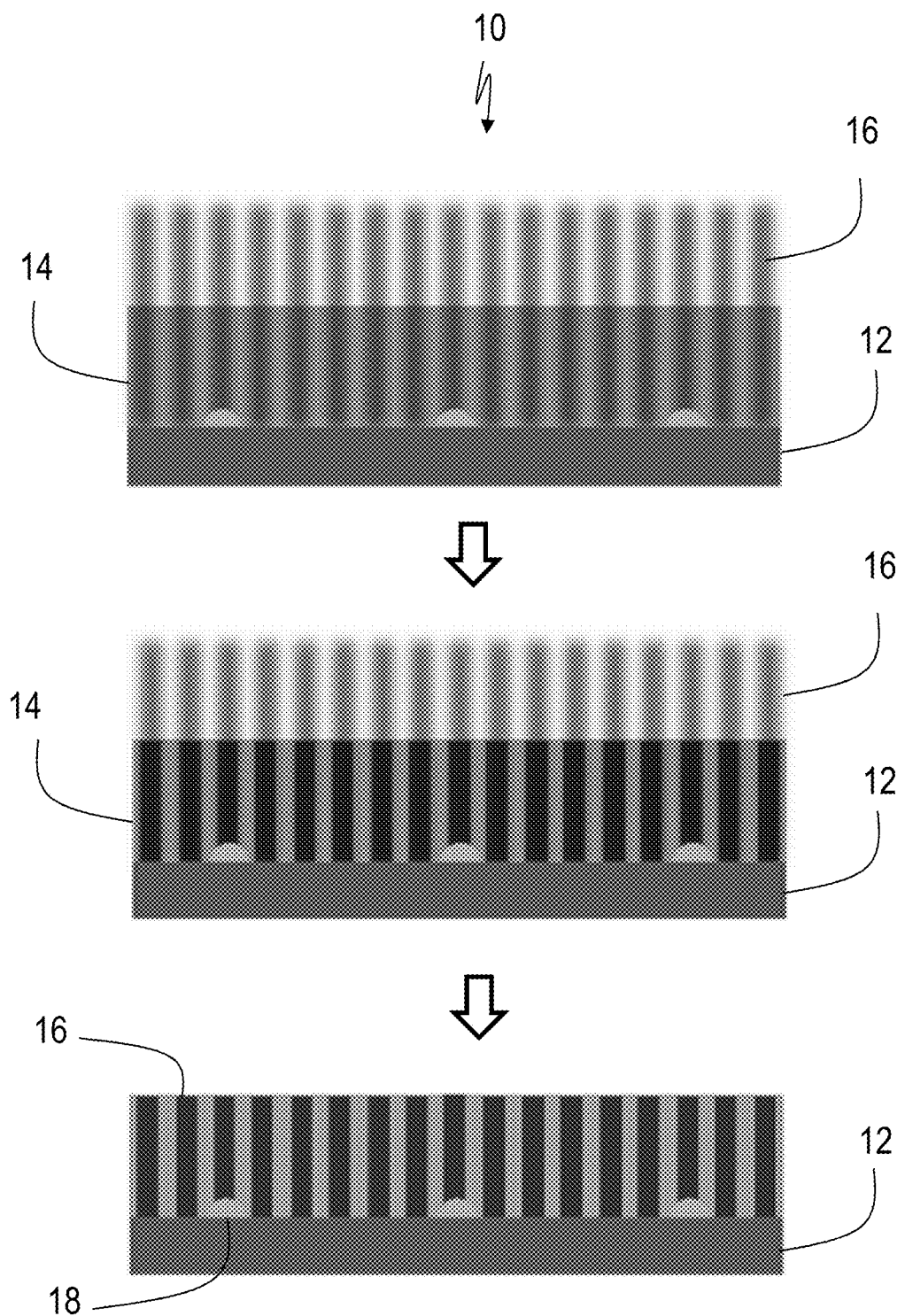
FIG. 1A is a schematic the fabrication of metallo-dielectric waveguide arrays according to the present invention directly over a silicon solar cell surface, where the resin is cast over the surface and irradiated with an array of blue optical beams that initiate and direct the concurrent phase separation and photoreduction of silver nanoparticles.
Figure 1B:
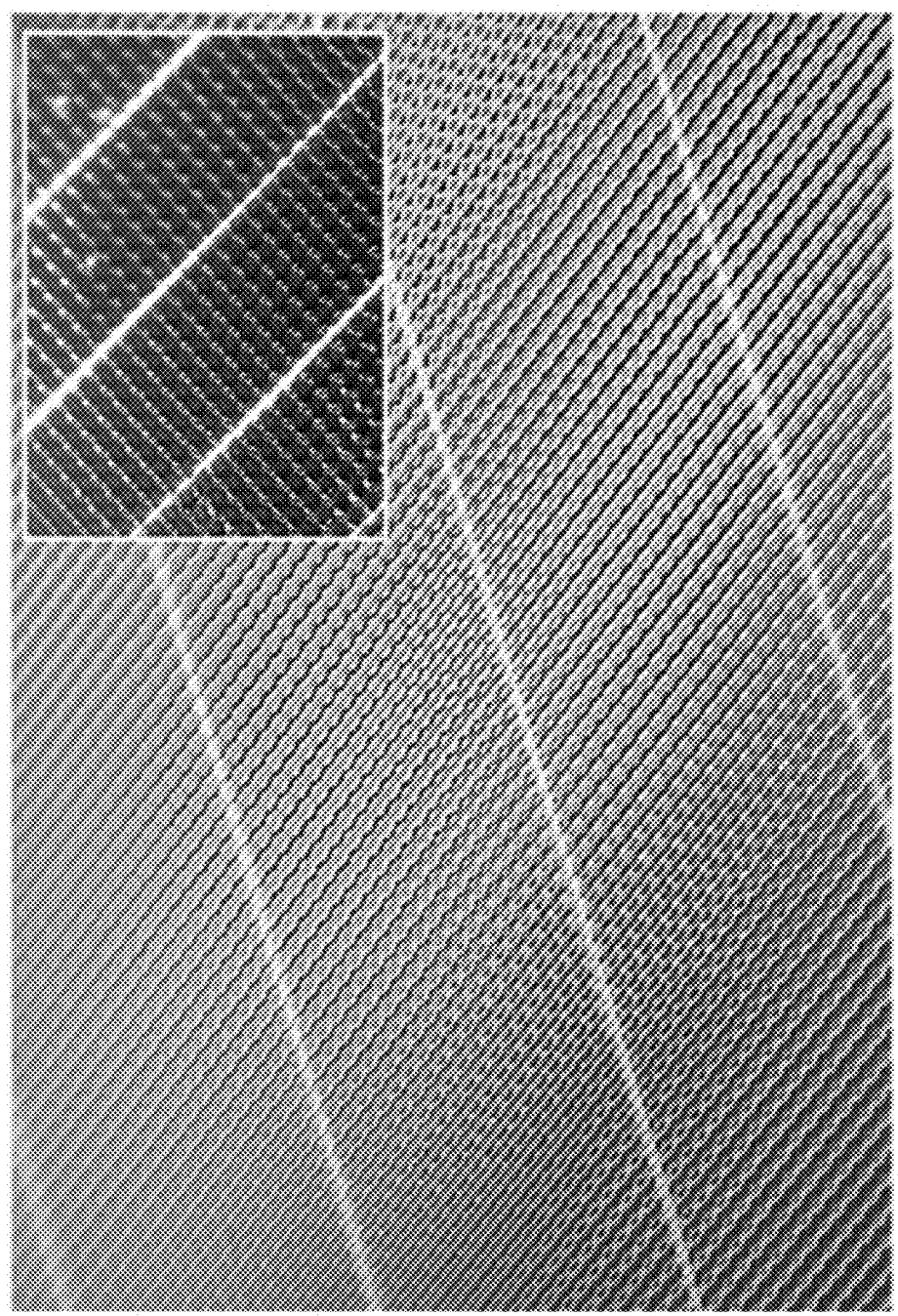
FIG. 1B is a macro-lens image of the large-scale, defect free waveguide array over the solar cell surface. Inset shows higher magnification image of the array in the location of a metallic top contact, indicating that no waveguides formed over the contact lines.

Referring to the figures, wherein like numeral refer to like parts throughout, there is seen in FIG. 1 a process 10 according to the present for directly forming the metallo-dielectric waveguide arrays over a solar cell surface 12 between the front contacts of the solar cell. Process 10 begins with the casting of a resin formulation 14 comprises a two component blend over solar cell surface 12. Resin 14 is irradiated by an array of blue LED beams 16, which facilitates the phase separation of the two component blend to form a core-cladding architecture, as well as concurrent photoreduction of the AgSbF$_6$ into Ag. The result is the formation of a vast array of periodically spaced cylindrical waveguides 16 located over the solar cell, which can be positioned to be between the front contacts 18 or over contacts 18. With waveguide arrays 16 directly processed over solar cell surface 12, there is no deleterious effect from the reflective contacts on the fabrication process, for example, back reflection of LED light, scattering, etc. In addition, waveguides 16 do not have to be produced over contacts 18, i.e., they are misaligned, so that any effect of the contacts 18 is very local, thereby allowing for vast, well-ordered waveguide arrays to be produced. This result of the present invention is critical, as it ensures the quality of the processed coatings and ensures optimal functionality in the collection of light. The directly processing and formation of vertically aligned waveguide arrays directly over a solar cell surface 12 according to the present invention is an advancement over the lamination of pre-made thin-films over the solar cell. Based on the alignment position of the mask, waveguides 16 can be formed over the contacts 18, if desired, or aligned so that the contacts lie in the spacing between waveguides 16.

Referring to FIG. 2, Raman volume maps reveal the spatial location of the nanoparticles in the waveguide arrays. These 3D volume images were created by mapping a Raman intensity signal for crystalline silver (peak) over x, y, z space. Higher intensities reveal regions with higher concentration of silver nanoparticles, owing to Raman peaks concentration dependence. Notably, the silver nanoparticles are located solely in the waveguide cores, as expected owing to these being the regions of high illumination by the optical beams. The distribution of the nanoparticles appears uniform over the length of the cylindrical cores, and the concentration slightly tapers at the peripheries in accordance with the drop in intensity of light which is confined to the self-written and formed waveguide during the fabrication process. Furthermore, there is no observation of phase separation of the nanoparticles in to the interstitial space (i.e., the waveguide common cladding surroundings). This is most likely due to the silver nanoparticles forming in conditions in which the NOA is highly crosslinked, and thus it cannot easily diffuse outside of the courses, yet the Ag salt precursor can diffuse from the dark regions into the bright to facilitate their consumption and continued growth of the particles Referring to FIG. 3, the present invention has ability to capture and transmitted optical energy incident over a wide range of incident angles along the waveguide axes. Preservation of the optical intensity located at the exit points of the individual waveguides is clearly observed. This is in contrast to the optical intensity for a uniform resin which shows increasingly dimmer intensity with increased incidence angle. The concept then is that a major of the optical energy retains a quasi-normally incident nature in terms of its angular direction upon which it impinges the underlying cell. Notably, the preservation of the optical intensity is visually enhanced for the silver nanoparticle metallo-dielectric waveguides as compared to the undoped waveguide arrays.

Previous work on the photo-reduction of noble metal nanoparticles places their size at around 10-50 nm, such that the plasmon absorbance peak of the silver nanoparticles is in the UV range, beyond the operation range of the nanoparticles, and thus the main mechanism by which the nanoparticles effect the waveguides is through scattering and refractive index volume averaging. FIG. 4($a$) shows transmission spectra of the waveguide array structures as a function of the different doping weight percent of $AgSbF_6$. Highly transparent samples in the visible and NIR region are produced. FIG. 4($b$) shows refractive index measurements of uniformly cured slabs of NOA65 with the sample relative doping concentrations, as a means to measure in bulk the expected refractive index of the waveguide core as a function of the quantity of silver nanoparticles. There is a drop in the refractive index of the polymer core, owing to the slight decrease in conversion of the polymer with increase silver precursor concentration, and this conversion to higher molecular weight is what causes the higher refractive index of the polymer. This acceptance range ($\Delta\theta$) of a waveguide is determined by the refractive index values of the core ($n_1$) and cladding ($n_2$) according to the relation derived based on total internal reflection for light entrant from surrounding air: $\sin(\Delta\theta/2)=\sqrt{n_1^2-n_2^2}$. Based on the refractive index values of the polymers (NOA:, PDMS:), a maximum acceptance range 30° should be achievable. However, the drop in refractive index is with increased weight percent of $AgSbF_6$ is quite small (0.003) such that the theoretical acceptance angle range is essentially based on the refractive index difference between the core and cladding.

All of the cured samples were transparent, indicating the formation of metallic particles in nanometer range size, was has been confirmed previously for TEM size analysis of samples (10-50 nm) photocured at the same intensity (as well as similar salt, $AgSbF_6$, and photoinitator concentrations, 1-5% and 2% respectively). Optical microscopy (FIG. 1) also indicates that the nanoparticles are well dispersed on the core (which is corroborated by Raman mapping), with no significant, macroscopic agglomerates. The small sizes also place the surface plasmon resonance of the silver nanoparticles to ~400 nm, at the edge boundary of the operational window of the silicon solar cells, and hence it is not disruptive to the efficiency (vide infra), as the operate more so as lossless scattering centers.

The solar cell performances of the metal-dielectric waveguides were compared relative to the waveguide with no silver nanoparticles, which have been established as widening the acceptance range relative to a uniform encapsulant. FIG. 5 shows external quantum efficiency measurements of encapsulated solar cells for the range of Ag doping concentrations explored for the laminated and directly processes films. The first observation is the abated of the drop of the EQE when employing metallo-dielectric waveguides relative to a regular waveguide arrays, especially for wide incident angles $\theta_{inc}>40°$. The EQE drops the least with increased incident angle for the sample with 0.5 wt % silver doping (FIG. 5($c$)), and this drop is less than for a uniform encapsulant (FIG. 5($a$)). For directly processed resins, two key observations are notable. The first at that the drop in the EQE for a regular waveguide array is less than for that produced through lamination, indicating that overall lamination could provide better efficiency performance as compared to lamination. This might be explained by the interface between the resin and the silicone priming layer used to planarize the silicon solar cell surface, which can cause additional back reflection of light which is lost from the cell. The second observation that that there is an reduction in the abatement in EQE when using metallo-dielectric waveguides; however, the difference among samples are smaller, yet the sample with 0.5 wt % silver still shows, nominally, the greatest abatement in the drop in EQE, specifically as assessed within the visible region of the spectra ($\lambda\sim725$ nm)

FIG. 6 shows the average EQE value as a function of incident angle for all encapsulants explored in this work. In the case of laminated films, the Ag doping concentrations from 0.1-2.0 wt % abate the drop in EQE with increased incident angle, as seen in FIG. 7($a$). The greatest abatement is observed from 0.5 wt %. The total EQEs overall are greater for solar cells with directly processed encapsulants, as seen in FIG. 7($b$), including a regular waveguide array (0 wt %). Because the EQE values all higher, the abatement is less pronounced, yet there is an enhancement in EQE when metallo-dielectric waveguides are employed.

FIG. 7 shows I-V curves for the encapsulated solar cells as a function of incident angle over the range of silver concentrations explored. All plots show a monotonic decrease in the short circuit currents with increase incident angle, which is a natural trend, owing to increase shading loss from the great apparent coverage of the contacts on the surface. While EQE spectra show enhancements to the conversion efficiency in encapsulated cells, the electrical output, specifically the short circuit current density ($J_{SC}$), reveals more complex interactions. Specific Ag concentrations lead to increases in $J_{SC}$ at particular incident angles. For example, waveguide arrays with 0.5 wt % $AgSbF_6$ increase $J_{SC}$, with respect to undoped samples, nominally by 3.5 mA/cm² at 0° and by ~1 mA/cm² at 60 and 70°; however, $J_{SC}$ is less or equal to an undoped waveguide array for intermediate angles. Waveguide arrays with 2 and 3 wt % AgSbF$_6$ increase $J_{SC}$ by ~0.5 mA/cm² (max) in the angular ranges of 0-30°. All other concentrations appear to provide no enhancement to the current density, despite their apparent increases in efficiency for particular angular ranges shown in FIG. 6b.

The variations in the EQE performance of the cells can be explained by the interactions of the waveguide and the nanoparticle scattering. At low incident angles, the waveguide properties are suitable for collecting light, and the nanoparticles as diffuse scatterers, scatters light out of the waveguide, which is not optimal lead to reduced efficiency. With increasing angle, beyond the collection range of the waveguide guides, scattering because beneficial, as it possess a redirecting effect, steering light otherwise outside of the collection range of the waveguides into the acceptance range, allowing for greater light collection. At even greater angles these collection effects can be sustained, particularly for lower doping concentrations, thereby provide enhancement at ultrawide angles. However, at greater concentrations, the scattering effect might over dominate, leading to reduced efficiency. It is also likely that the silver nanoparticles enables scattering of light beyond the loss cone of the solar cell. Similar measurements were performed on solar cells that were covered in pre-cured waveguide array thin-films. Overall, the efficiency and current density were more stable and better performance was observed for solar cells with encapsulants directly processed over it.

Arrays of metallodielectric waveguides were fabrication in thin-films consisting of a binary component blend of polymers and a silver salt as the metal source. The structures were tested as encapsulant materials for silicon solar cells for their wide-angle collection properties. Increases in both the conversion efficiency and the current output over a wide range of incident angles are observed, with a specific weight fraction of silver dopant attaining the maximum conversion efficiency and current output. The present invention is thus a promising approach for solar cell encapsulants that can increase solar cell output over the course of the day and across seasons.

Thus, the present invention comprises metallo-dielectric waveguide array structures that are produced by combining light-induce self-writing in a two-component photopolymerizable blend with concurrent in situ synthesis of silver nanoparticles via photoreduction of a silver salt (AgSbF$_6$). The waveguide array structures are processed directly over the silicon solar cell via casting the precursor resin and then irradiating the resin from above an array of microscale UV optical beams, making the process compatible with the processing of modules. Irradiation with an array of UV beams creates periodic waveguide architectures with the waveguide cores consisting of a homogenous distribution of silver nanoparticles. The present invention includes a waveguide array structure that provides a baseline structure for a wider acceptance window, and the nanoparticles impart optical functionality—through light scattering—to the resulting waveguide array structure, thereby enhancing the collection range through a combination of waveguide and scattering of light in the waveguide cores. This enables transformation of wide incident angle light rays into quasi-normally incident light, thereby mitigation shadow losses and increasing light collection and conversion.

As described above, the present invention was tested by systematically varying the AgSbF$_6$ to produce waveguide cores with different silver nanoparticle concentrations. The results show an increase in the external quantum efficiency over the angular range (0-70°) and a nominal increase in the current density of 1 mA/cm². Advantageously, preparing the structures from a single photocurable formulation aligns with the imperative to maintain the approach as straightforward and easily integrated into manufacturing photovoltaic modules. The combination of light self-trapping and the intensity-dependent photo-reduction of the silver salt enables the nanoparticle formation specifically in the desired high index regions of the structure.

EXAMPLE

Following are the specific details for the experiments described above:

Materials. Norland Optical Adhesive 65 (hereon referred to as NOA65) was purchase from Norland Products Inc. and an epoxide-terminated PDMS oligomer and Silver hexafluoroantimonate(V) (AgSbF$_6$) from Sigma-Aldrich. The free-radical photoinitiator camphorquinone (CQ) was purchased from Sigma-Aldrich and cationic initiator (4-octyloxyphenyl) phenyliodonium hexafluoroantimonate (OPPI) from Hampford Research Inc. All chemicals were used as received.

Preparation of Photopolymerizable Media. Polymer blends were prepared by mixing PDMS and NOA65 in a 1:1 by weight fraction with OPPI (1.5 wt % of total mixture) and different weight fractions of AgSbF$_6$ (0.1-3.0 wt % of total mixture). The vial containing the mixture was protected from ambient light, placed on a magnetic stirrer, and mixed for ~24 hours prior to use. The mixture was poured into a circular well fabricated from a Teflon ring placed over a transparent plastic substrate. Relative weight fractions of PDMS and NOA65 are expressed herein as a ratio of PDMS/NOA65 (wt %/wt %).

Photopolymerization of the blends. The mixture was irradiated with collimated UV light generated from a Xenon lamp source (~30 mW/cm²). The light was first passed through an optical mask consisting of an array (of square or hexagonal symmetry) of apertures of diameter 40 μm and spacing of 200 μm.

Two approached for encapsulation of the solar cells were explored. In the first approach, the encapsulation was synthesized separately, as previously reported, and then laminated on the solar cell, which was first planarized with a thin layer of silicone (Sylgard 184). This approach is hereon referred as a lamination. In the second approach, the resin was casted over the solar cell, and irradiated with the array of optical beams from above. This approach is hereon referred to a direct processing.

Refractive Index Measurements. Refractive index values for photocured NOA65—Silver formations were measured with an Abbe refractometer (Atago, NAR-1T SOLID).

Raman volume mapping. Raman spectra of the processed encapsulants were acquired with a confocal Raman microscope (Renishaw, InVia) using a 785 nm continuous wave (CW) diode laser. The system combined the Raman spectrometer and a Leica DM2700P microscope. Raman volume images were created by collecting spectra at spacing intervals of 10 μm in x, y, and z directions. The phase separation is revealed by 3D mapping of the ratio of the C=O peak of NOA65 to the Si—CH$_3$ peak of the PDMS to identify NOA-rich regions.

Solar Cell Measurements. A quantum efficiency system (IQE 200B, Newport) with wavelength range of 300-1100 nm was used to measure the external quantum efficiency (EQE) of a planar multi-crystalline Silicon screen-printed solar cell with dimensions 5 cm×5 cm×0.5 mm, and a measured short circuit current density of 35.5 mA/cm². The EQE measurement setup includes a 300-watt xenon arc lamp whose emitted light is modulated by a chopper at 80 Hz and dispersed by a monochromator consist of sorting filters to produce the light output. The output light was focused on the photopolymerized sample placed over the solar cell, which was first coated with a thin "priming" layer (~0.12 mm) of PDMS (Sylgard). EQE measurements at different angles were achieved by placing the encapsulated solar cell on machined, ramp-shaped blocks of different inclination angles. External quantum efficiency measurements were carried out according to the ASTM standard (E1021-15). The beam cross-section was circular with a diameter of ~1 cm. All measurements were conducted in the same region of the solar cell. The total EQE was determined based on the spectral response of the encapsulated cell to the AM 1.5 G solar reference spectrum and the EQE($\lambda$) data, calculated according to the equation:

$$\frac{\int \phi(\lambda) \cdot EQE(\lambda) d\lambda}{\int \phi(\lambda) d\lambda} \times 100\% \qquad (1)$$

Where $\phi$ ($\lambda$) is the photon flux of AM 1.5 G at a wavelength, $\lambda$. Equation 1 expresses the total EQE as a weighted average across the wavelength range investigated.

Current-Voltage Measurements. Current-voltage (I-V) curves of the encapsulated solar cells were collected under irradiation (AM 1.5 G) using an ABB class solar simulator (Newport 94021A) at an intensity of 1 Sun (100 mW/cm²).

In another embodiment of the invention, irradiation may be provided at an angle to the mask used to define the waveguide array so that the resulting waveguides 16 are positioned at an angle to normal relative to surface 12. Several arrays of columns of waveguides 16 can be produced to provide a wide angular window of collection. As seen in FIG. 10, a wide variety of angles may be produced. In addition, multiple irradiation sources may be used to simultaneously form waveguides 16 form an intersecting lattice, as seen in FIG. 9. For example, lattices of waveguides 16 may be formed in binary component polymer blends using irradiation (~1 hour) using a multi-beam configuration that comprises several collimated LED sources (5-10 mW/cm2). The light sources are transmitted through a common mask, as seen in FIG. 12, to concurrently generate multiple intersecting arrays of optical beams, all of which will produce a waveguide having a lattice structure, as seen in FIG. 13. The symmetry of the arrangement may be changed by varying the number of beams and their respective orientations, as seen in FIG. 14A through 14D. The self-writing of each beam occurs independently of any other propagating or intersecting filaments.

Different orientation configurations are possible, which may be expressed as sets of angular orientations of the core axes with respect to the normal of the air-film interface. For example, the combinations shown in FIGS. 14A through 14D are (−15, 15°), (−30, 0 ,30°), (−15, 0, 15°), and (−15, 15°), respectively. Within the diameter range of the core that supports broadband light (i.e., D>10 µm), smaller core sizes can accommodate smaller spacing (S), which increases the overall waveguide density, yet over dense arrays may result in cross-talk and less light confinement.

Using a high refractive index commercial acrylate (Norland Optics, NOA65) and a low refractive index epoxide terminated polydimethyl siloxane (PDMS). Refractive index values (both in their cured state) of 1.653 and 1.412, respectively, yield a maximum possible refractive index difference ($\Delta$n) between waveguide core and cladding of approximately 0.241, which can provide an acceptance range from approximately −30 to +30°. PDMS provides elastomeric properties to the thin-films and is beneficial for handling the mechanical and thermal stresses in applications. Based on this refractive index difference, three waveguide lattices oriented so that their acceptance windows are adjacent should be sufficient to cover the angular range of light of interest. The boundaries of the acceptance window change as the waveguide core becomes more slanted with respect to the air-film interface. The overlap of adjacent waveguide collection ranges are expected to provide greater changes to the propagation direction of incident light; hence, a range of 3-lattice configurations over a range waveguide orientation combinations: e.g., (−30, 0, 30°), (−20, 0, 20°), (−15, 0, 15°) may be manufactured to determine optimal configurations. Common to these arrangements is the "primary" waveguide lattice oriented at 0°. Additionally, 4-lattice configurations, e.g., (−30, −15, 15, 30°), i.e., no primary waveguide lattice, may also be synthesized, as normally incident light can still be collected by either the −15° or +15° lattice. Waveguides 16 of this embodiment may be made with or without the nanoparticles described above, as the angling of waveguides 16 can provide the desired ultra-wide collection angle in the absence of the nanoparticles.

What is claimed is:

1. A solar cell, comprising:
a surface having a series of contacts thereon; and
a resin cast over the surface and the series of contacts, wherein the resin defines a series of waveguides that extend through the resin normally relative to the surface, wherein each of the waveguides comprises a core and a cladding for total internal reflection with the core having a plurality of silver nanoparticles distributed therein.

2. The solar cell of claim 1, wherein the series of waveguides are aligned to extend through the resin is misalignment with the series of contacts.

3. The solar cell of claim 1, wherein the series of waveguides are aligned to extend through the resin in alignment with the plurality of series of contacts.

4. The solar cell of claim 1, wherein the silver nanoparticles comprise $AgSbF_6$.

5. The solar cell of claim 1, wherein the silver nanoparticles have a diameter of between 10 and 50 nanometers.

6. The solar cell of claim 1, the resin comprises a polymerized blend of polydimethylsiloxane and an optical adhesive.

7. The solar call of claim 1, wherein a concentration of the plurality of silver nanoparticles in the core comprises between 0.1 and 0.5 percent by weight.

8. A method of preparing a solar cell, comprising the steps of:
providing a solar cell surface having a series of contacts thereon;
casting a resin over the solar cell surface, wherein the resin includes a plurality of silver nanoparticles,
irradiating the resin to cause polymerization of the resin until a series of waveguides form in and extend through in the resin normally relative to the solar cell surface, wherein each of the waveguides are formed from a core and a cladding for total internal reflection and the nanoparticles are present in the core of each of the waveguides.

9. The method of claim 8, wherein the step of irradiating the resin comprises exposing the resin to blue light.

10. The method of claim 9, wherein the step of irradiating the resin comprises exposing the resin to blue light through a mask defining a size and a location for each of the series of waveguides.

11. The method of claim 10, wherein the mask includes a series of apertures having a diameter of 40 μm and that are spaced apart by 200 μm, each of which defines one of the series of waveguides.

12. The method of claim 8, wherein the series of waveguides that form in the resin are misaligned with the series of contacts.

13. The method of claim 8, wherein the series of waveguides that form in the resin are aligned with the series of contacts.

14. The method of claim 8, wherein the plurality of silver nanoparticles comprise $AgSbF_6$.

15. The method of claim 14, wherein the plurality of silver nanoparticles have a diameter of between 10 and 50 nanometers.

16. The method of claim 15, wherein a concentration of the plurality of silver nanoparticles in the core comprises between 0.1 and 0.5 percent by weight.

17. The method of claim 16, the resin comprises a polymerized blend of polydimethylsiloxane and an optical adhesive.

18. A solar cell, comprising:
a surface having a series of contacts thereon; and
a resin cast over the surface and the series of contacts and including a series of waveguides that extend through the resin, wherein the series of waveguides extend at an angle other than normal relative to the surface, and wherein each of the waveguides comprises a core and a cladding for total internal reflection with a plurality of silver nanoparticles distributed in the core.

19. The solar cell of claim 18, wherein the series of waveguides extend at more than one angle other than normal relative to the surface.

20. The solar cell of claim 19, wherein the series of waveguides are arranged to form a lattice.

* * * * *